(12) United States Patent
Lee et al.

(10) Patent No.: US 9,891,594 B2
(45) Date of Patent: Feb. 13, 2018

(54) HETEROGENEOUS SAMPLING DELAY LINE-BASED TIME TO DIGITAL CONVERTER

(71) Applicant: Seoul National University R&DB Foundation, Seoul (KR)

(72) Inventors: Jae Sung Lee, Seoul (KR); Jun Yeon Won, Seoul (KR)

(73) Assignee: SEOUL NATIONAL UNIVERSITY R&DB FOUNDATION, Seoul (KR)

( * ) Notice: Subject to any disclaimer, the term of this patent is extended or adjusted under 35 U.S.C. 154(b) by 0 days.

(21) Appl. No.: 15/520,906

(22) PCT Filed: Aug. 26, 2015

(86) PCT No.: PCT/KR2015/008912
§ 371 (c)(1),
(2) Date: Apr. 21, 2017

(87) PCT Pub. No.: WO2016/072600
PCT Pub. Date: May 12, 2016

(65) Prior Publication Data
US 2018/0017944 A1     Jan. 18, 2018

(30) Foreign Application Priority Data
Nov. 7, 2014   (KR) .......................... 10-2014-0154763

(51) Int. Cl.
*G04F 10/00* (2006.01)
*H03K 5/14* (2014.01)
(Continued)

(52) U.S. Cl.
CPC ............. *G04F 10/005* (2013.01); *H03K 5/14* (2013.01); *H03K 2005/00013* (2013.01); *H03L 7/06* (2013.01)

(58) Field of Classification Search
None
See application file for complete search history.

(56) References Cited

U.S. PATENT DOCUMENTS 7,791,525 B2 * 9/2010 Rivoir .................. G04F 10/005
341/155
7,930,121 B2 * 4/2011 Brantley ................. G04F 10/04
702/125

(Continued)

FOREIGN PATENT DOCUMENTS

JP      11-177399      7/1999
JP      2009-218729    9/2009
(Continued)

OTHER PUBLICATIONS

Jinhong Wang et al., "The 10-ps Multitime Measurements Averaging TDC Implemented in an FPGA", IEEE Transactions on Nuclear Science, vol. 58, No. 4, Aug. 2011, pp. 2011-2018.
(Continued)

*Primary Examiner* — Howard Williams
(74) *Attorney, Agent, or Firm* — Lex IP Meister, PLLC

(57) ABSTRACT

A delay line-based time to digital converter includes: a coarse counter for counting a pulse of a timing clock and measuring a time when an edge of an input signal is detected; a fine time interpolator including a plurality of first delay elements and a plurality of second delay elements, a delay line with the input signal as an input, and a flip-flop unit with outputs of the first delay element or outputs of the second delay elements as inputs and the timing clock as an operation frequency; and a timestamp generator for receiving a digital value on a time measured by the coarse counter and the fine time interpolator, and generating a timestamp on the input signal by using the received digital value.

6 Claims, 11 Drawing Sheets

(51) Int. Cl.
*H03K 5/00* (2006.01)
*H03L 7/06* (2006.01)

(56) References Cited

U.S. PATENT DOCUMENTS

| | | | | |
|---|---|---|---|---|
| 9,356,773 | B2* | 5/2016 | Zhou | H04L 7/0331 |
| 2010/0295590 | A1 | 11/2010 | Yoshihara | |
| 2016/0246262 | A1* | 8/2016 | Liu | G04F 10/005 |

FOREIGN PATENT DOCUMENTS

| JP | 2012-114716 | 6/2012 |
|---|---|---|
| JP | 2012-175598 | 9/2012 |
| JP | 2012-191093 | 10/2012 |
| KR | 10-2008-0043978 | 5/2008 |
| KR | 10-0982103 | 9/2010 |
| KR | 10-2012-0003928 | 1/2012 |
| KR | 10-2012-0028337 | 3/2012 |
| KR | 10-2012-0113546 | 10/2012 |

OTHER PUBLICATIONS

Qi Shen et al., "A Multi-chain Measurements Averaging TDC Implemented in a 40 nm FPGA", IEEE RT 2014, Published in: Real Time Conference (RT), 2014 19th IEEE-NPSS, May 26-30, 2014.
Jun Yeon Won et al., "Linearized Tapped-Delay-Line Time-to-Digital Converter for Time-of-Flight Positron Emission Tomography", 7th Korea-Japan Meeting on Medical Physics, Sep. 2014.
Jun Yeon Won et al., "Linearity Improvement of the FPGA-Based Time-to-Digital Converter (TDC) Using Dual-Output Tapped-Delay Line" IEEE Nuclear Science Symposium (NSS), Nov. 10, 2014 in Seattle, U.S.A.
Jun Yeon Won et al., "Time-to-Digital Converter Using a Tuned-Delay Line Evaluated in 28-, 40-, and 45-nm FPGAs", IEEE Transactions on Instrumentation and Measurement, vol. 65, No. 7, Jul. 2016.

* cited by examiner

HETEROGENEOUS SAMPLING DELAY LINE-BASED TIME TO DIGITAL CONVERTER

BACKGROUND OF THE INVENTION

(a) Field of the Invention

A heterogeneous sampling delay line-based time-digital converter is provided.

(b) Description of the Related Art

In general, as shown in FIG. 1, a delay line-based time-digital converter includes: a PLL unit 10 for supplying a clock signal (Clock_out); a coarse counter 20 for measuring a time of an input signal (Hit) with a time resolution of a clock signal period; and a fine time interpolator 30 for precisely measuring the time of the input signal (Hit) with a time resolution that is less than an operation frequency period.

The coarse counter 20 counts a pulse of a system clock signal that is an operation signal, and outputs a counted value. In detail, as shown in FIG. 2A, the coarse counter 20 counts the pulse of the system clock signal (Clock) (i.e., operation frequency) generated after a rising edge (i.e., a time when an event is generated) of the input signal (Hit) to measure the same.

However, the system clock signal (Clock) and the input signal (Hit) are input in an asynchronous manner, so the rising edge of the system clock signal (Clock) does not correspond to the rising edge of the input signal (Hit) as shown in FIG. 2A. That is, the rising edge of the input signal (Hit) is provided in one periodical pulse of the system clock signal (Clock).

To measure a rising edge time of the input signal (Hit) provided in the one periodical pulse of the system clock signal (Clock), the delay line-based time-digital converter includes the fine time interpolator 30. The fine time interpolator 30 uses a delay line 31 including a plurality of delay elements (d1, d2, d3, and d4) connected in series to each other and a flip-flop 32, and in detail, it uses the respective delay elements (d1, d2, d3, and d4) of the delay line 31 to delay the rising edge of the input signal (Hit) so that it may be synchronized with the rising edge of the system clock (Clock), and the delay time in this instance is measured to measure a fine time of the input signal (Hit) provided within one period pulse of the system clock (Clock).

Considering the case shown in FIG. 2B, the first delay element d1 outputs the value of 1 for the delay signal of the input signal (Hit) with reference to the rising edge of the system clock (Clock), the second delay element d2 outputs the value of 1, the third delay element d3 outputs the value of 0, and the fourth delay element d4 outputs the value of 0. As a result, assuming that the delay line 31 is configured with four delay elements, an output value of the delay line 31 output by a D flip-flop becomes 1100.

A time of the system clock signal (Clock) within one period may be precisely measured by detecting a change (the change of from 1 to 0) of a logic value of the fine time interpolator 30 output by the delay line 31.

However, when the delay line-based time-digital converter is realized and the delay time of the delay line is not constant or the delay time is long, a time quantization error may increase and sufficient time resolution may not be acquired.

A conventional delay line-based time-digital converter may be further described with reference to FIG. 3 and FIG. 4.

FIG. 3 shows a timing diagram when a delay time of each delay line is not constant so delay times are inaccurate in a conventional delay line-based time-digital converter.

The input signal (Hit) is input to the delay element d1 as an input signal, it is delayed by a time of $t_{l1}$, and it is output as an output signal of d1, and the output signal of d1 is input to the delay element d2 as an input signal, it is delayed by a time of $t_{s1}$, and it is output as an output signal of d2. The output signal of d2 is input to the delay element d3 as an input signal, it is delayed by a time of $t_{l2}$, and it is output as an output signal of d3, and the output signal of d3 is input to the delay element d4 as an input signal, it is delayed by a time $t_{s2}$, and it is output as an output signal of d4.

Regarding the conventional delay line-based time-digital converter, respective delay elements may be a same kind of delay elements, and when the same kind of delay elements are used, the times delayed through the delay elements may become different as shown in FIG. 3. When the same kind of delay elements are used, intervals of the delay times may become non-uniform depending on disposal of delay elements on a circuit and errors generated during a procedure of processing delay elements. For example, the times $t_{l1}$ and $t_{l2}$ delayed by passing through the delay elements d1 and d3 may be greater than the times $t_{s1}$ and $t_{s2}$ delayed by passing through the delay elements d2 and d4.

When the intervals of the delay times are non-uniform and the timing clocks (Clock 1, Clock2, and Clock 3) for three cases are set to be an operational frequency of a flip-flop 32 as shown in FIG. 3, the time quantization error is found to increase.

For example, when a rising edge of the first timing clock (Clock 1) is generated after the rising edge of the input signal (Hit) by the time of $t_{p1}$, its position is set to be "a", and positions at which the rising edges of the second timing clock (Clock 2) and the third timing clock (Clock 3) are generated when a predetermined time passed after the rising edge of the input signal (Hit) are set to be "b" and "c", respectively. Here, $t_{p1}$ is a delay time of the input signal (Hit) when the first timing clock (Clock 1) is used, and $t_{p2}$ is a delay time of the input signal when the second timing clock (Clock 2) is used.

When a phase difference between the first timing clock (Clock 1) and the second timing clock (Clock 2) is $t_{p2}-t_{p1}$, the delay time of the delay element d3 is $t_{l2}$ which is longer than the phase difference, so the output of the delay line 31 output by the D flip-flop of the fine time interpolator 30 is identically 1100. In this case, as shown in FIG. 4, a fine code may be detected with a number of states of the delay signals that are transited to 1, and may be calculated to be 2. The fine code may be a number of transited stated values of the delay element generated when the input signal (Hit) passes through the delay element within one period of the timing clock (Clock) as an output value of the flip-flop with reference to the rising edge of the timing clock (Clock). The fine code value is used to speculate the delay time of the input signal (Hit), and the delay line-based time-digital converter may calculate the delay time of the input signal (Hit) to be longer as the fine code value becomes greater.

Therefore, the case in which the input signal (Hit) is synchronized with a same signal as the second timing clock (Clock 2) has the same fine code value as the case in which the input signal (Hit) is synchronized with a same signal as the first timing clock (Clock 1), so the delay line-based time-digital converter may identically calculate the delay times of the input signal (Hit). Actually, the delay times of the input signal (Hit) are differently $t_{p1}$ and $t_{p2}$, but as they are considered to be the same delay time and are then calculated, the time quantization error may increase.

FIG. 4 shows changes of a fine code value when delay times of respective delay element of a conventional delay line-based time-digital converter are non-uniform.

Referring to FIG. 4, an x axis represents a generation time ($t_c$) of a rising edge of a timing clock (Clock) in one period of the timing clock (Clock), and a y axis indicates a fine code value. For example, when respective delay elements delay the input signal (Hit) with a delay time shown in FIG. 3, delay time intervals may have a non-uniform graph form as shown in FIG. 4. When the rising edges of the timing clocks (Clock 1, Clock 2, and Clock 3) of three cases are generated at the times a, b, and c, the delay line-based time-digital converter may calculate the fine code values as 2, 2, and 3. As described above, when the generation times of the rising edges of the timing clock (Clock) are differently a and b, the fine code value is identically calculated as 2, so the delay time of the input signal (Hit) is identically calculated to generate a large time quantization error.

The conventional delay line-based time-digital converter may cause non-uniform delay times when the same kind of delay element is used, thereby generating a large time quantization error.

The above information disclosed in this Background section is only for enhancement of understanding of the background of the invention and therefore it may contain information that does not form the prior art that is already known in this country to a person of ordinary skill in the art.

SUMMARY OF THE INVENTION

The present invention has been made in an effort to provide a time-digital converter that is finer in a same circuit realization environment by improving a delay time of a delay line to be uniform.

An exemplary embodiment of the present invention may be used to achieve objects which are not specifically mentioned other than the above-mentioned object.

An exemplary embodiment of the present invention provides a delay line-based time to digital converter including: a coarse counter for counting a pulse of a timing clock and measuring a time when an edge of an input signal is detected; a fine time interpolator including a plurality of first delay elements and a plurality of second delay elements, a delay line with the input signal as an input, and a flip-flop unit with outputs of the first delay element or outputs of the second delay elements as inputs and the timing clock as an operation frequency; and a timestamp generator for receiving a digital value on a time measured by the coarse counter and the fine time interpolator, and generating a timestamp on the input signal by using the received digital value.

The fine time interpolator may further include a multiplexer unit having outputs of the first delay element and outputs of the second delay elements as inputs, and outputting one of the input signals, and the output of the multiplexer unit may be an input to the flip-flop unit.

The delay line-based time-to-digital converter may further include a fine time information generator for calculating a digital value of a fine code for measuring a fine time by adding numbers of a value that is passed through a same type of delay element to be state-transited and output from among values output through the flip-flop unit.

The delay line-based time-to-digital converter may further include a fine time information generator for encoding a value output through the flip-flop unit.

The plurality of first delay elements may be different from the plurality of second delay elements, and the plurality of first delay elements or the plurality of second delay elements are a buffer, a gate, an inverter, a carry chain, or a multiplexer.

A carry primitive of a field programmable gate array (FPGA) may be used so as to realize the plurality of first delay elements or the plurality of second delay elements.

According to an embodiment of the present invention, the delay time of the delay line is improved to be uniform so the time-digital converter that is finer in the same circuit realization environment may be provided.

DETAILED DESCRIPTION OF THE EMBODIMENTS

Figure 1:
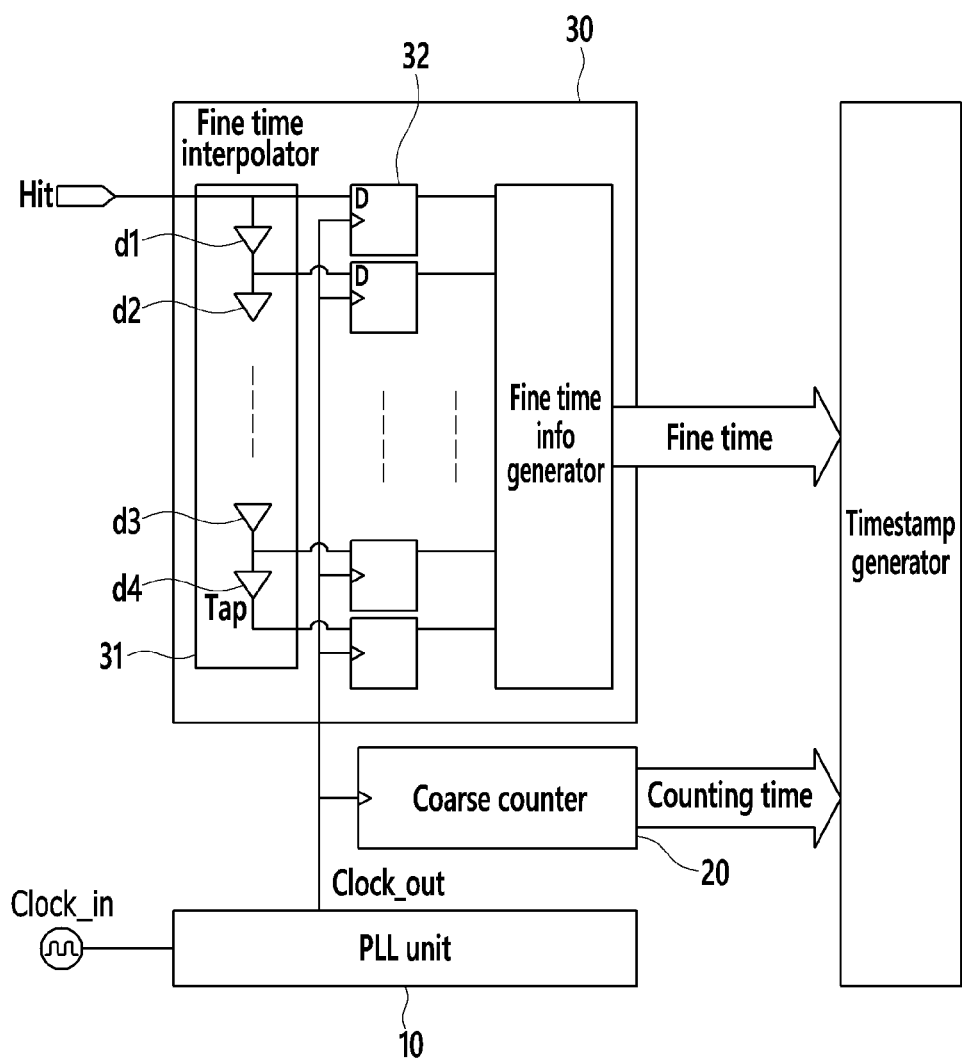
FIG. 1 shows a block diagram of a delay line-based time-digital converter according to a conventional exemplary embodiment.
Figure 2A:
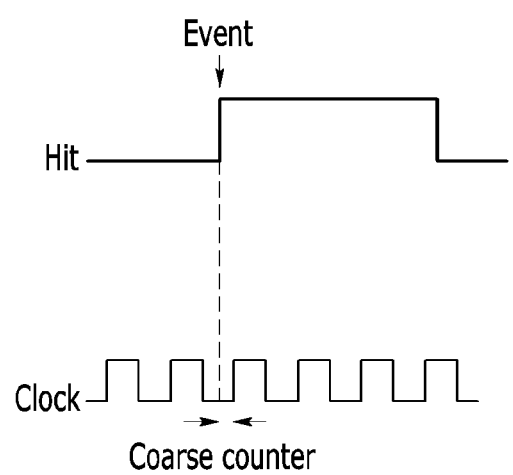
FIG. 2A and FIG. 2B show a timing diagram of an operation of a delay line-based time-digital converter according to a conventional exemplary embodiment.
Figure 2B:
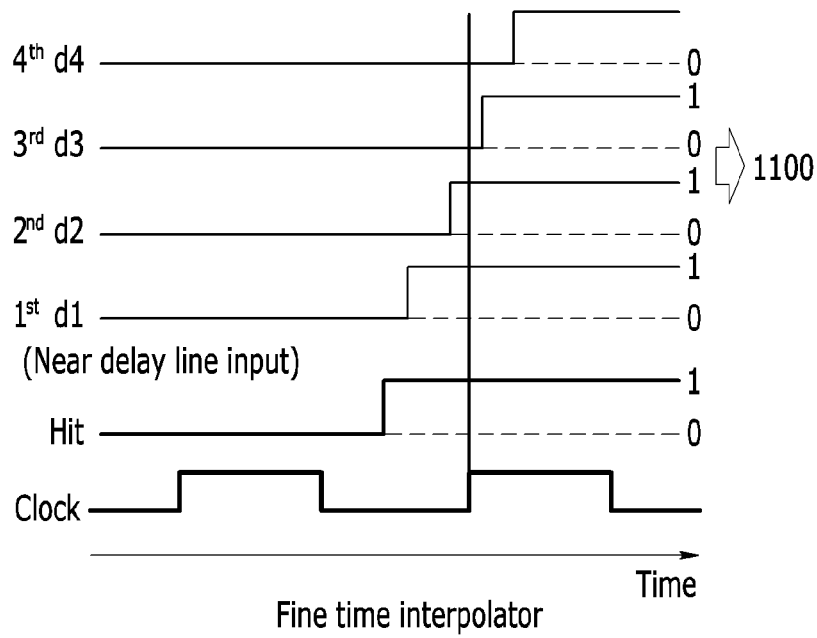
Figure 3:
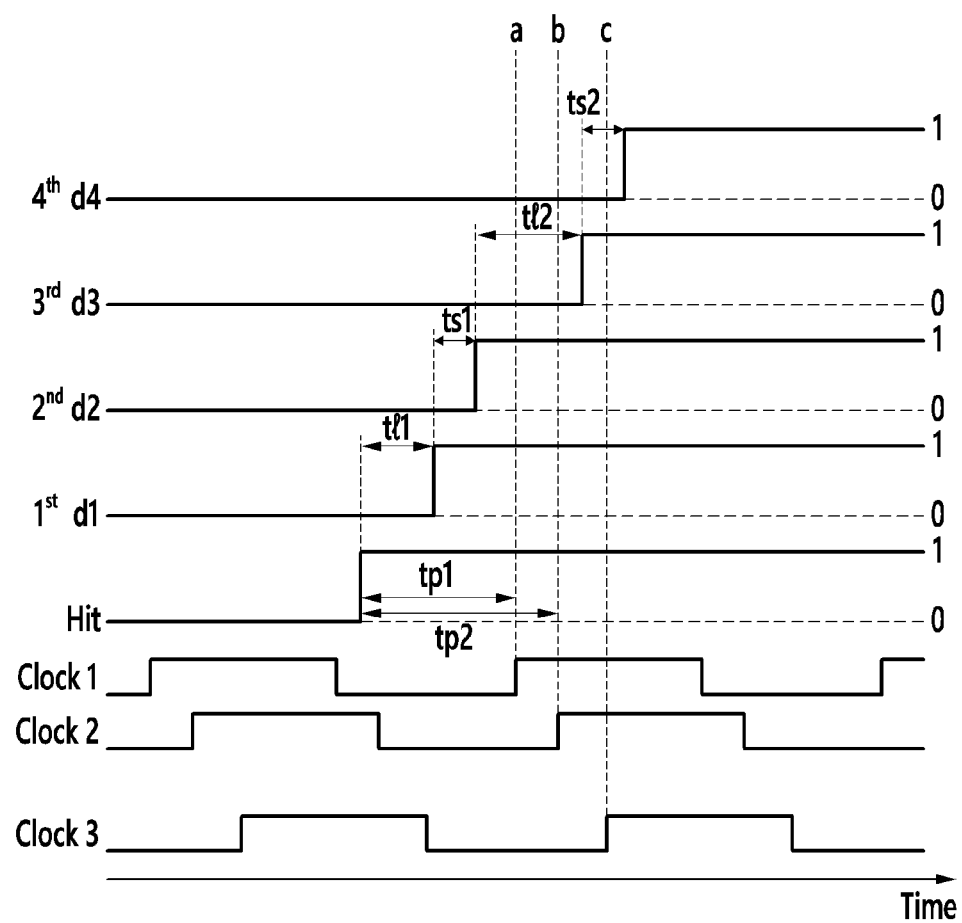
FIG. 3 shows a timing diagram when a delay time of each delay line is not constant so delay times are inaccurate in a conventional delay line-based time-digital converter.
Figure 4:
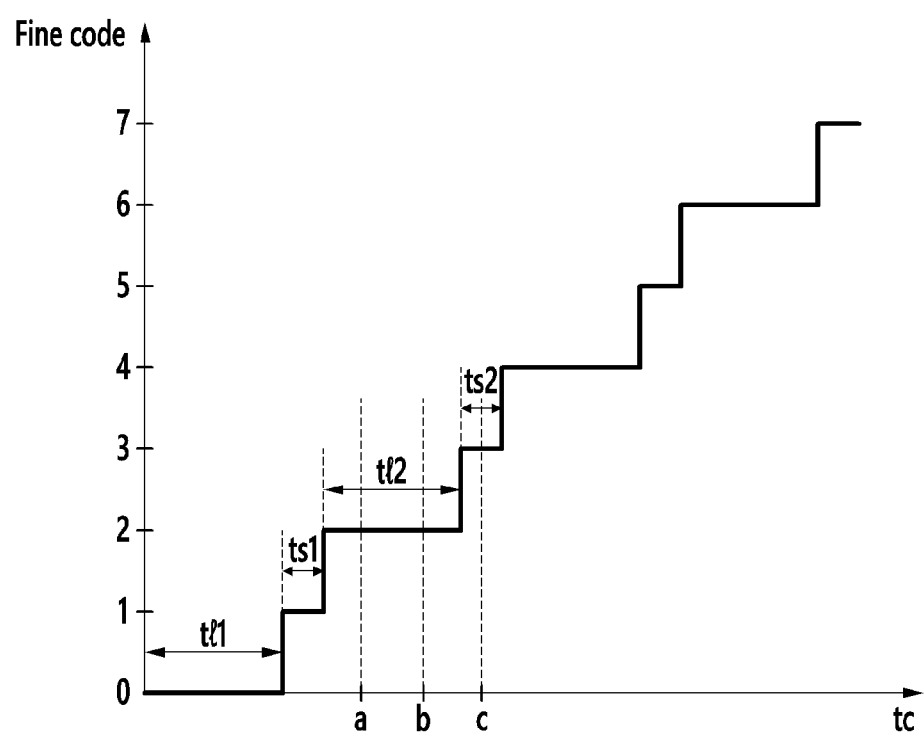
FIG. 4 shows changes of a fine code value when delay times of respective delay element of a conventional delay line-based time-digital converter are non-uniform.

The present invention will be described more fully hereinafter with reference to the accompanying drawings, in which exemplary embodiments of the invention are illustrated. As those skilled in the art would realize, the described embodiments may be modified in various different ways, all without departing from the spirit or scope of the present invention. The drawings and description are to be regarded as illustrative in nature and not restrictive and like reference numerals designate like elements throughout the specification. Further, a detailed description of a well-known related art will be omitted.

Throughout the specification, unless explicitly described to the contrary, the word "comprise" and variations such as "comprises" or "comprising" will be understood to imply the inclusion of stated elements but not the exclusion of any other elements. In addition, the terms "-er", "-or", and "module" described in the specification mean units for processing at least one function and operation, and can be implemented by hardware components or software components and combinations thereof.

An exemplary embodiment of the present invention for generating a uniform delay time will now be described with reference to FIG. 5.

Figure 5:
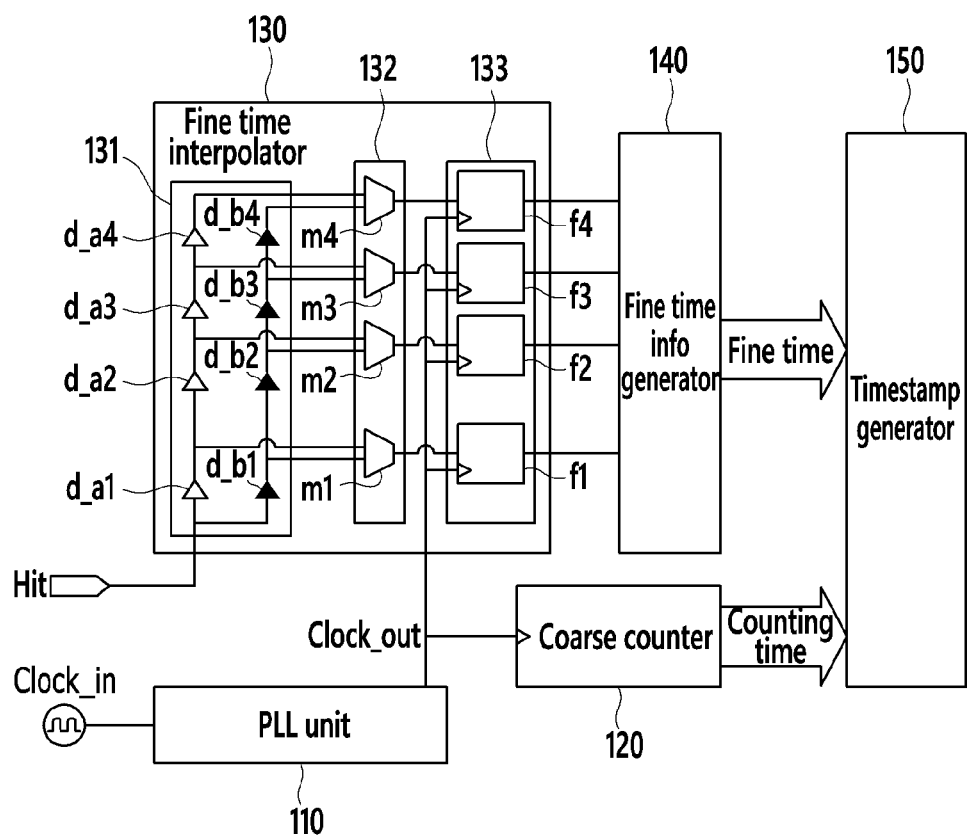
FIG. 5 shows a block diagram of a delay line-based time-digital converter according to an exemplary embodiment of the present invention.

FIG. 5 shows a block diagram of a delay line-based time-digital converter according to an exemplary embodiment of the present invention.

The delay line-based time-digital converter includes a PLL unit 110, a coarse counter 120, a fine time interpolator 130, a fine time information generator 140, and a timestamp generator 150.

The PLL unit 110 receives an input clock signal (Clock_in), generates a timing clock (Clock_out), and outputs the same.

The coarse counter 120 sets the timing clock (Clock_out) as an operation frequency and a period of the timing clock (Clock_out) as a time resolution to measure a time for detecting a rising edge or a falling edge of the input signal (Hit). For example, the coarse counter 120 may output a digital value of the input signal (Hit) for each rising edge of the timing clock (Clock_out), may count a number of pulses from a counting start time to a time when the digital value changes from 0 to 1 or from 1 to 0 to measure a time of the input signal (Hit), and may output a digital value of the measured time.

The fine time interpolator 130 includes a delay line 131, a multiplexer unit 132, and a flip-flop unit 133, and uses the timing clock (Clock_out) to measure a fine time of the input signal (Hit).

The delay line 131 receives the input signal (Hit) as an input, and is configured with a plurality of types of delay elements. For example, same type of delay elements d_a1 to d_a4 are coupled in series to the delay line 131 of FIG. 5, same type of delay elements d_b1 to d_b4 are coupled in series thereto, therefore two types of delay elements are configured, and same type of four delay elements are coupled in series.

FIG. 5 shows an exemplary embodiment in which the same type of delay elements are coupled in series, but the present invention should not be understood to be limited thereto, and the output from the delay element may be applied to another delay element as an input. For example, different types of delay lines may be connected to each other such that d_b2 may receive an output of d_a1 as an input signal.

FIG. 5 shows two kinds of delay elements and four of the same kind of delay elements, and without being limited to this, the delay line 131 may be configured with a plurality of types of delay elements and a plurality of one kind of delay elements.

The delay element configuring the delay line 131 is a logic element having a delay time when a logic value is changed, and for example, it may be a buffer, a gate, an inverter, a carry chain, or a multiplexer.

Regarding the delay line 131 shown in FIG. 5, an input signal (Hit) is applied to different types of delay elements d_a1 and d_b1, the delay elements generate output signals, and the output signals may be input signals input to a multiplexer m1 of the multiplexer unit 132. According to a selection of one of the input signals by the multiplexer m1, one input signal becomes an output signal of the multiplexer, and the output signal may be an input signal input to a flip-flop f1 of the flip-flop unit 133.

The signals output by the two types of delay elements d_a1 and d_b1 may be input signals input to the same types of second delay elements d_a2 and d_b2. Further, one signal output by one type of delay element may be an input signal input to a plurality of different types of second delay elements, and signals output by two types of delay elements may be input signals input to different types of second delay elements. When the input signals are applied to the delay elements d_a2 and d_b2, the delay elements generates output signals that may be input signals input to a multiplexer m2 of the multiplexer unit 132, and according to a selection of one of the input signals, the one input signal may be an output signal output to the multiplexer m2 and may be an input signal input to a flip-flop f2 of the flip-flop unit 133. This same method may be applied to the other delay elements (d_a3, d_a4, d_b3, and d_b4), the multiplexers m3 and m4, and the flip-flops f3 and f4.

The multiplexer unit 132 receives outputs from a plurality of types of delay elements, and outputs one of the inputs. The multiplexer unit 132 in FIG. 5 is shown to output one of the two inputs, but is not limited thereto.

A standard for selecting the input signal to be applied as an output from among the input signals of the multiplexer is to select the output of the delay element for making the delay time of the delay line uniform as the input signal. For example, the delay times generated when passing through the delay elements d_a1 and d_b1 may be compared to the delay times generated when passing through the delay elements d_a2 and d_b2, and one of the output signals of d_a1 and d_b1 may be selected as an input signal to be applied as an output of the multiplexer m1 so that the intervals of the delay times may be uniform. In a like manner, one of the output signals of d_a2 and d_b2 may be selected as an input signal to be applied as an output of the multiplexer m2 so that the intervals of the delay times may be uniform. The same method may be applied to the other delay elements (d_a3, d_a4, d_b3, and d_b4) and the multiplexers m3 and m4.

An output signal of the multiplexer of the multiplexer unit 132 becomes an input signal of the flip-flop of the flip-flop unit 133.

The flip-flop unit 133 sets the output of the multiplexer unit 132 as an input and sets the timing clock (Clock_out) as an operation frequency. The flip-flop of the flip-flop unit 133 may be a D flip-flop.

Further, when the fine time interpolator 130 does not include the multiplexer unit 132, the flip-flop unit 133 may set the output of the delay element of the delay line 131 as an input. For example, one of the output signals of the delay element d_a1 and the delay element d_b1 may not be selected by the multiplexer m1 as an input of the flip-flop f1, and the output signals of the delay element d_a1 and the delay element d_b1 may be inputs of the flip-flop of the flip-flop unit 133. Therefore, when the fine time interpolator 130 does not include the multiplexer unit 132, the number of flip-flops of the flip-flop unit 133 may be increased. In a like manner, the output signals of the other delay elements (d_a2, d_b2, d_a3, d_b3, d_a4, and d_b4) may be inputs of the flip-flop of the flip-flop unit 133.

When the delay line 131 is configured with a plurality of types of delay elements and the outputs provided by a plurality of types of delay elements are sampled not by the multiplexer unit 132 but by the flip-flop unit 133, the intervals of the delay times may be reduced, thereby improving a time resolution.

The fine time information generator 140 an encoder function. The encoder function is to reduce the number of bits of the digital signal output by the flip-flop unit 133 by a predetermined number of bits. For example, when the signal output by the flip-flop unit 133 is 1100 as four bits, it is calculated with the fine code value of 2 to reduce the same into a 2-bit digital value.

The fine time information generator 140 may calculate the digital value of the fine code by adding the number of values that are state-transited by passing through the same type of delay elements and are output from among the values output through the flip-flop unit 133. For example, when the value output through the flip-flop unit 133 is 111000 and the multiplexer unit 132 alternately selects the outputs of the two types of delay elements with the output signal, the fine time information generator 140 may calculate the number of values that are passed through the first type of delay elements to transit the state from 0 to 1 and are then output as 2, and may calculate the number of values that are passed through the second type of delay elements to transit the state from 0 to 1 and are then output as 1. The fine time information generator 140 may add the numbers of the output values respectively to calculate 3 as the digital value of the fine code.

Further, the fine time information generator 140 may encode the value output through the flip-flop unit 133. For example, it may encode 111000 that is the value output through the flip-flop unit 133 as 3.

When the output of the delay element is state-transited from 1 to 0 because of the state transition of the input signal (Hit), the fine time information generator 140 may calculate the number of 0's that are output by passing through the corresponding type of delay elements from among the output values of the flip-flop unit 133 and may calculate the same as the digital value of the fine code.

As described, the digital signal calculated by the fine time information generator 140 is provided to the timestamp generator 150. The timestamp generator 150 receives a digital value on the time measured by the coarse counter 120 and the fine time interpolator 130, and generates a timestamp on the input signal (Hit) by using the received digital value.

A method for a time-digital converter using a plurality of types of outputs according to an exemplary embodiment of the present invention to make a delay time uniform will now be described with reference to FIG. 6 and FIG. 7.

Figure 6:
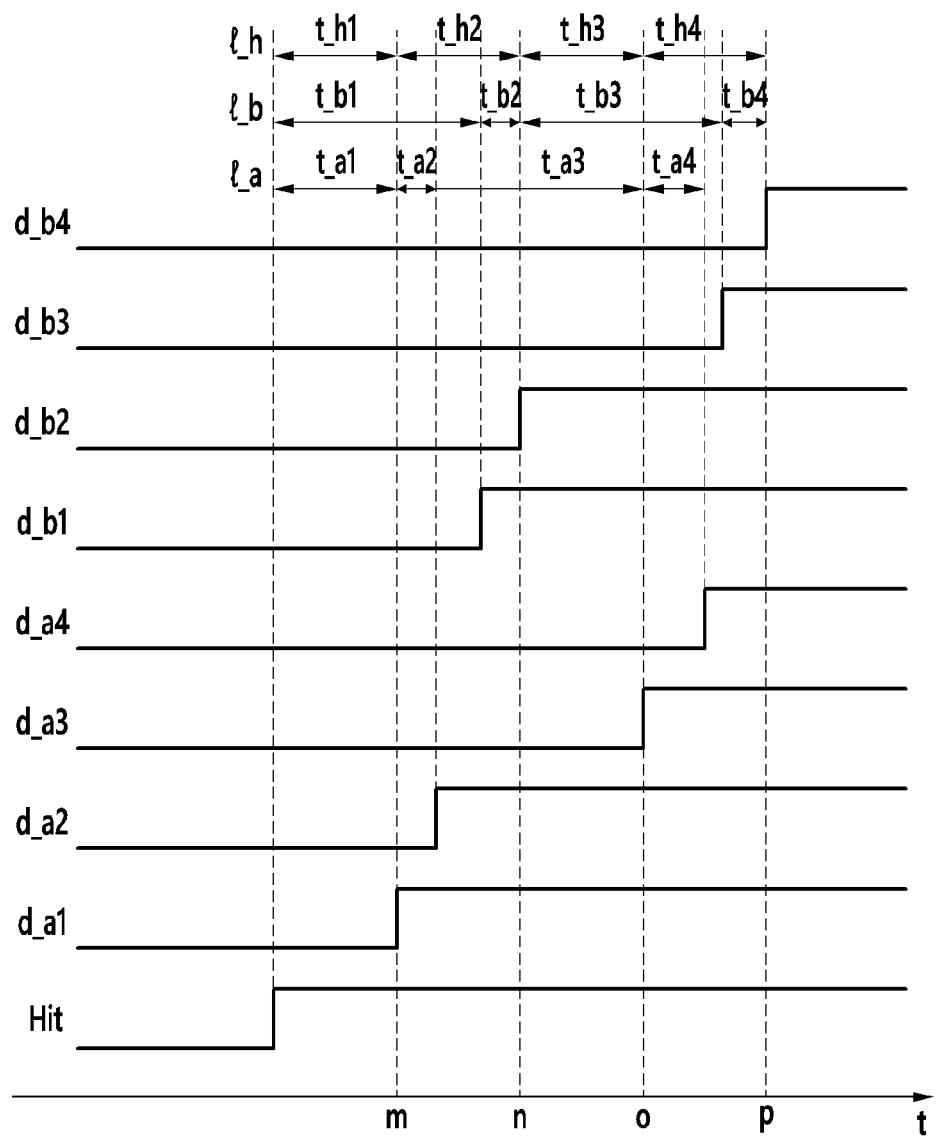
FIG. 6 shows a timing diagram for showing outputs of a delay line for an input signal according to exemplary embodiment of the present invention.

FIG. 6 shows a timing diagram for showing outputs of a delay line for an input signal according to exemplary embodiment of the present invention.

When the delay elements d_a1 to d_a4 are used, in a like manner of l_a, the delay time caused by d_a1 may be t_a1, the delay time caused by d_a2 may be t_a2, the delay time caused by d_a3 may be t_a3, and the delay time caused by d_a4 may be t_a4. As shown from l_a, when delay elements d_a1 to d_a4 of one type are used, the delay times may not be uniform. Accordingly, as described above, the time quantization error may increase.

In a like manner, when the delay elements d_b1 to d_b4 are used, in a like manner of l_b, the delay time caused by d_b1 may be t_b1, the delay time caused by d_b2 may be t_b2, the delay time caused by d_b3 may be t_b3, and the delay time caused by d_b4 may be t_b4. As can be shown from l_b, when delay elements d_b1 to d_b4 of one type are used, the delay times may not be uniform.

On the contrary, when a plurality of types of delay elements are used to select an output for making the delay time uniform from among the output of a plurality of types of delay elements, the delay times may be made more uniform compared to the case of using the same type of delay elements.

For example, as shown in FIG. 6, when the outputs of d_a1, d_b2, d_a3, and d_b4 are selected as outputs to be provided to the flip-flop unit 133 by using two types of delay elements, the delay times may be made more uniform compared to the case of using the same type of delay elements. As shown from l_h, the intervals of the delay times of the delay line input to the flip-flop unit 133 may uniformly be t_h1, t_h2, t_h3, and t_h4.

Figure 7A:
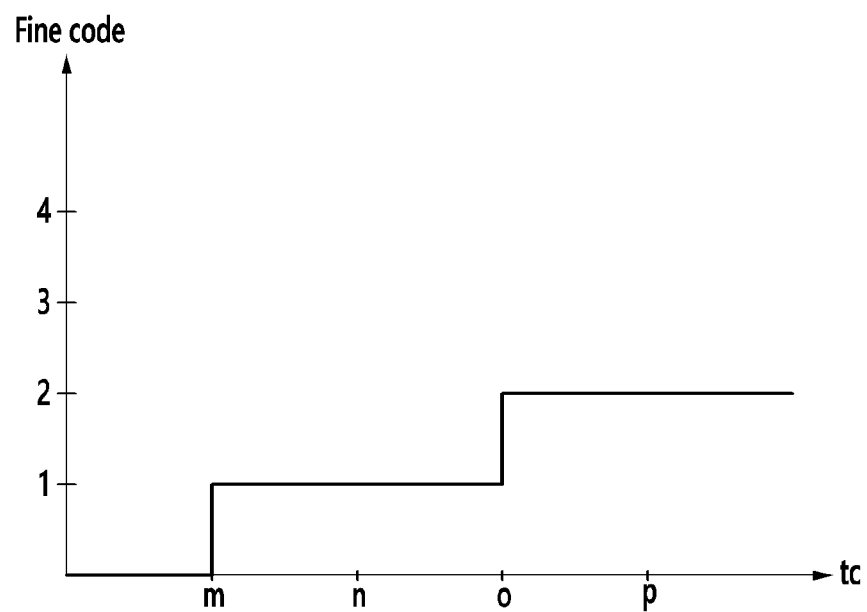
FIG. 7A and FIG. 7B show changes of a fine code value of a delay line-based time-digital converter using a same kind of delay elements.
Figure 7B:
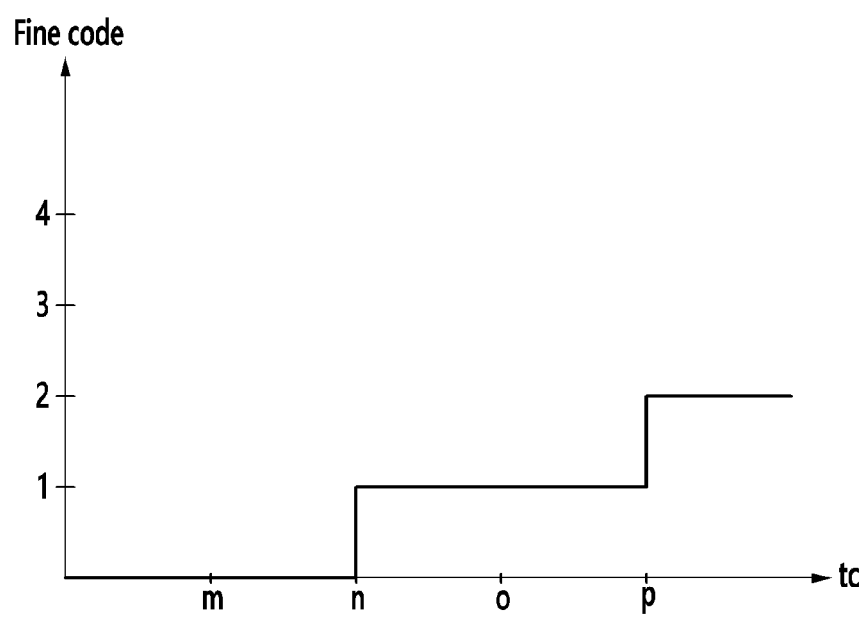

FIG. 7A and FIG. 7B show changes of a fine code value of a delay line-based time-digital converter using a same kind of delay elements.

Figure 7C:
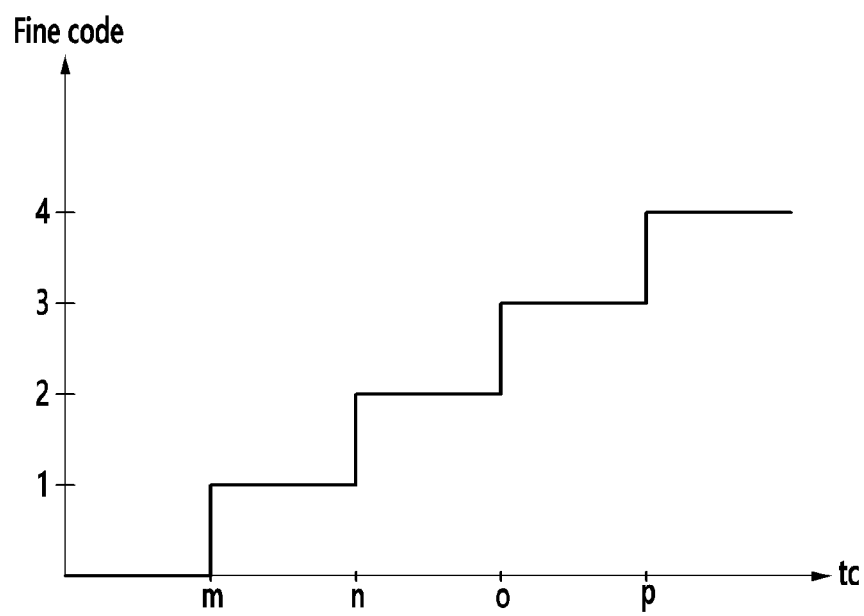
FIG. 7C shows changes of a fine code value of a delay line-based time-digital converter according to an exemplary embodiment of the present invention.

FIG. 7C shows changes of a fine code value of a delay line-based time-digital converter according to an exemplary embodiment of the present invention.

Referring to FIG. 7A to FIG. 7C, $t_c$, which is the x axis, represents a generation time of a rising edge of the timing clock (Clock_out) within one period of the timing clock (Clock_out), and the y axis indicates a fine code value.

FIG. 7A shows changes of fine code values for delay elements selected to have a uniform delay time from among the delay elements d_a1 to d_a4. The delay elements selected to have a uniform delay time are d_a1 and d_a3, so the fine code value is changed at points m and o.

In a like manner, FIG. 7B shows changes of fine code values for delay elements selected to have a uniform delay time from among the delay elements d_b1 and d_b4. The delay elements selected to have a uniform delay time are d_b2 and d_b4, so the fine code value is changed at points n and p.

The delay line-based time-digital converter according to an exemplary embodiment of the present invention uses a plurality of types of delay elements for making the delay time uniform. Therefore, the changes of the fine code values may be shown with a sum of the graphs of FIG. 7A and FIG. 7B, and the fine code value may be changed at uniform intervals as shown in FIG. 7C, thereby reducing the time quantization error.

Figure 8:
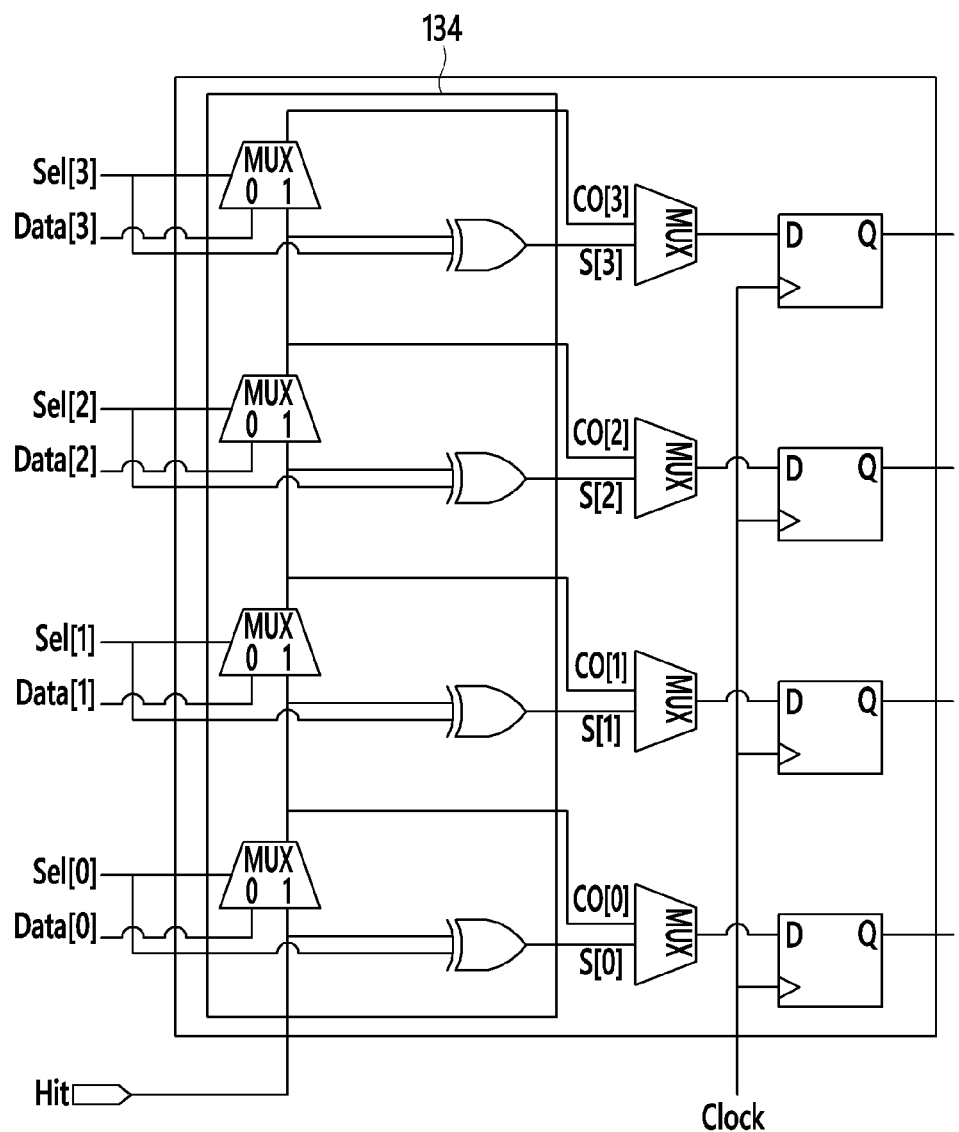
FIG. 8 shows a block diagram of a fine time interpolator using a multiplexer and an xor gate according to an exemplary embodiment of the present invention.

FIG. 8 shows a block diagram of a fine time interpolator using a multiplexer and an xor gate according to an exemplary embodiment of the present invention. FIG. 8 configures the delay line with two types of delay elements including a multiplexer (MUX) and an xor gate.

It may be realized by use of a carry primitive 134. The carry primitive 134 may be used in a field-programmable gate array (FPGA). The carry primitive 134 may use a carry output (CO) provided as an output of the multiplexer and a sum output (S) provided as an output of the xor gate as a plurality of types of outputs.

The multiplexer unit 132 may select the output for making the delay time of the delay line uniform between the carry output and the sum output, and may transmit the selected output to the flip-flop unit 133.

The multiplexer of the carry primitive 134 of FIG. 8 may maintain the value of 1 for inputting the input signal by a selection signal (Sel) so as to output the delayed input signal (Hit).

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A delay line-based time-to-digital converter comprising:
   a coarse counter for counting a pulse of a timing clock and measuring a time when an edge of an input signal is detected;

a fine time interpolator including a plurality of first delay elements and a plurality of second delay elements forming delay lines with the input signal as an input, and a flip-flop unit with outputs of the first delay elements or outputs of the second delay elements as inputs and the timing clock as an operation frequency; and a timestamp generator for receiving a digital value on a time measured by the coarse counter and the fine time interpolator, and generating a timestamp on the input signal by using the received digital value.

2. The delay line-based time-to-digital converter of claim 1, wherein
the fine time interpolator further includes
a multiplexer unit having outputs of the first delay elements and outputs of the second delay elements as inputs, and outputting one of the input signals, and
the output of the multiplexer unit is an input to the flip-flop unit.

3. The delay line-based time-to-digital converter of claim 1, further comprising
a fine time information generator for calculating a digital value of a fine code for measuring a fine time by adding numbers of a value that is passed through a same type of delay element to be state-transited and output from among values output through the flip-flop unit.

4. The delay line-based time-to-digital converter of claim 1, further comprising
a fine time information generator for encoding a value output through the flip-flop unit.

5. The delay line-based time-to-digital converter of claim 1, wherein
the plurality of first delay elements are different from the plurality of second delay elements, and
the plurality of first delay elements or the plurality of second delay elements are a buffer, a gate, an inverter, a carry chain, or a multiplexer.

6. The delay line-based time-to-digital converter of claim 1, wherein
a carry primitive of a field programmable gate array (FPGA) is used so as to realize the plurality of first delay elements or the plurality of second delay elements.

* * * * *